United States Patent
Singh et al.

(10) Patent No.: US 10,720,407 B2
(45) Date of Patent: Jul. 21, 2020

(54) MICROELECTRONIC INTERPOSER FOR A MICROELECTRONIC PACKAGE

(71) Applicant: Intel Corporation, Santa Clara, CA (US)

(72) Inventors: Navneet K. Singh, Bangalore (IN); Ranjul Balakrishnan, Bangalore (IN)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 16/210,540

(22) Filed: Dec. 5, 2018

(65) Prior Publication Data
US 2019/0109115 A1 Apr. 11, 2019

Related U.S. Application Data

(63) Continuation of application No. 15/262,935, filed on Sep. 12, 2016, now Pat. No. 10,199,353.

(51) Int. Cl.
H01L 25/065 (2006.01)
H01L 23/498 (2006.01)
H01L 23/538 (2006.01)
H01L 23/13 (2006.01)

(52) U.S. Cl.
CPC .......... H01L 25/0652 (2013.01); H01L 23/13 (2013.01); H01L 23/49811 (2013.01); H01L 23/5381 (2013.01); H01L 23/5383 (2013.01); H01L 23/5386 (2013.01); H01L 23/5385 (2013.01); H01L 2224/16225 (2013.01); H01L 2225/0652 (2013.01); H01L 2225/06517 (2013.01); H01L 2225/06572 (2013.01)

(58) Field of Classification Search
CPC .................. H01L 23/5381; H01L 23/5383
See application file for complete search history.

(56) References Cited

U.S. PATENT DOCUMENTS

| 9,780,072 | B2* | 10/2017 | Jeng ................. H01L 23/49822 |
| 2002/0149097 | A1 | 10/2002 | Lee et al. |
| 2005/0255637 | A1 | 11/2005 | Bolken |
| 2011/0265324 | A1 | 11/2011 | Sakamoto et al. |
| 2013/0292853 | A1 | 11/2013 | Ye et al. |
| 2013/0337648 | A1 | 12/2013 | Lin et al. |
| 2015/0155256 | A1* | 6/2015 | Lin ........................ H01L 24/81 257/737 |

(Continued)

OTHER PUBLICATIONS

Final Office Action for U.S. Appl. No. 15/262,935 notified Nov. 15, 2017.

(Continued)

Primary Examiner — Farun Lu
(74) Attorney, Agent, or Firm — Green, Howard & Mughal LLP.

(57) ABSTRACT

A microelectronic interposer for a microelectronic package may be fabricated, wherein a first microelectronic device within the microelectronic package is in electronic communication with at least one second microelectronic device through the microelectronic interposer which positions the at least one second microelectronic device outside a periphery of the first microelectronic device. The microelectronic interposer may further include at least one recess for achieving a desired height and/or enabling various configurations for the microelectronic package.

20 Claims, 8 Drawing Sheets

(56) References Cited

U.S. PATENT DOCUMENTS

2016/0042978 A1* 2/2016 Wang .................. H01L 25/50
                                                        257/773
2016/0111396 A1   4/2016 Kim
2016/0218093 A1   7/2016 Mortensen et al.

OTHER PUBLICATIONS

International Search Report and Written Opinion for International Patent Application No. PCT/US17/46383, dated Nov. 20, 2017.
Notice of Allowance for U.S. Appl. No. 15/262,935, dated Oct. 3, 2018.
Office Action for U.S. Appl. No. 15/262,935, notified on May 25, 2018.
Office Action for U.S. Appl. No. 15/262,935, notified Jul. 10, 2017.
International Preliminary Report on Patentability for PCT Application No. PCT/US17/46383, dated Mar. 21, 2019.

* cited by examiner

MICROELECTRONIC INTERPOSER FOR A MICROELECTRONIC PACKAGE

CLAIM OF PRIORITY

This application is a continuation of and claims priority to U.S. patent application Ser. No. 15/262,935, filed on Sep. 12, 2016 and titled "A MICROELECTRONIC INTERPOSER FOR A MICROELECTRONIC PACKAGE", which is incorporated by reference in its entirety.

TECHNICAL FIELD

Embodiments of the present description generally relate to the field of microelectronic packaging, and, more particularly, to a microelectronic interposer for a microelectronic package, wherein a first microelectronic device within the microelectronic package is in electronic communication with at least one second microelectronic device through the microelectronic interposer which positions the at least one second microelectronic device outside a periphery of the first microelectronic device.

BACKGROUND

The microelectronic industry is continually striving to produce ever faster, smaller, and thinner microelectronic packages for use in various electronic products, including, but not limited to, computer server products and portable products, such as wearable microelectronic systems, portable computers, electronic tablets, cellular phones, digital cameras, and the like. One route to achieve these goals is the fabrication of System-on-Chip (SoC) packages, wherein virtually all of the components of an electronic system are fabricated on a single chip. Such devices, may have a volatile memory package (such as a low-power DRAM) stacked thereon to support the operation of the System-on-Chip package, thereby forming a Package-on-Package (PoP) device stack. Such volatile memory packages are generally designed only for use with specific System-on-Chip (SoC) package and attached with a solder ball grid array, and, thus, do not provide any other memory options. Furthermore, such specifically designed volatile memory packages are very expensive relatively to standard, non-specific volatile memory packages. Therefore, there is a need to develop novel microelectronic die stacking configurations that may provide a means to utilize standard, non-specific volatile memory packages with System-on-Chips (SoC) for use in low cost market segments.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DESCRIPTION OF EMBODIMENTS

Figure 1:
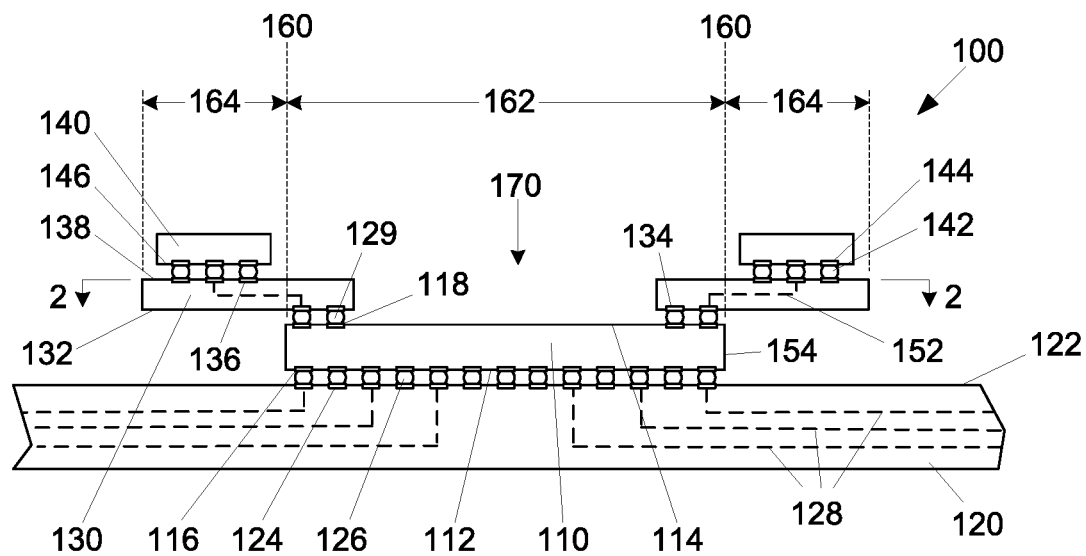
FIG. 1 illustrates a side cross-sectional view of a microelectronic structure having a microelectronic interposer, according to one embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Embodiments of the present description may include a microelectronic interposer for a microelectronic package, wherein a first microelectronic device within the microelectronic package is in electronic communication with at least one second microelectronic device through the microelectronic interposer which positions the at least one second microelectronic device outside a periphery of the first microelectronic device. The microelectronic interposer may further include at least one recess for achieving a desired height and/or enabling various configurations for the microelectronic package.

FIG. 1 illustrates a microelectronic structure 100, which may include at least one first microelectronic device 110, such as a system-on-chip device, a microprocessor, a chipset, a graphics device, a wireless device, a memory device, an application specific integrated circuit, or the like, attached to a microelectronic substrate 120, such as a motherboard, through a plurality of first microelectronic device-to-substrate interconnects 126. The first microelectronic device-to-substrate interconnects 126 may extend between bond pads 116 on a first surface 112 of the first microelectronic device 110 and corresponding bond pads 124 on a first surface 122 of the microelectronic substrate 120, in a configuration generally known as a flip-chip or controlled collapse chip connection ("C4") configuration. The bond pads 116 on the first surface 112 of the first microelectronic device 110 may be in electrical communication with integrated circuitry (not shown) within the first microelectronic device 110. The microelectronic substrate bond pads 124 may be in electrical communication with conductive routes 128 within the microelectronic substrate 120. The microelectronic substrate conductive routes 128 may provide electrical communication routes between the first microelectronic device 110 and other external components (not shown).

As further shown in FIG. 1, a microelectronic interposer 130 may be attached to the first microelectronic device 110 through a plurality of first microelectronic device-to-interposer interconnects 129. The first microelectronic device-to-interposer interconnects 129 may extend between bond pads 118 on a second surface 114 of the first microelectronic device 110 and corresponding first plurality of bond pads 134 on a first surface 132 of the microelectronic interposer 130. The bond pads 118 on the second surface 114 of the first microelectronic device 110 may be in electrical communication with integrated circuitry (not shown) within the first microelectronic device 110.

At least one second microelectronic device 140 may be attached to the microelectronic interposer 130 through a plurality of second device-to-interposer interconnects 142. The second device-to-interposer interconnects 142 may extend between bond pads 144 on a first surface 146 of the second microelectronic device 140 and corresponding second plurality of bond pads 136 on a microelectronic interposer second surface 138. The second microelectronic device bond pads 144 may be in electrical communication with integrated circuitry (not shown) within the second microelectronic device 140.

The first plurality of interposer bond pads 134 may be in electrical communication with the second plurality of interposer bond pads 136 with conductive routes 152 within the microelectronic interposer 130. In one embodiment, each of the second plurality of interposer bond pads 136 is electronic connected to its corresponding bond pad within the first plurality of interposer bond pads 134.

As shown in FIG. 1, the first microelectronic device 110 includes at least one side 154 extending between the first microelectronic device first surface 112 and the first microelectronic device second surface 114. As shown FIG. 2, the at least one side 154 may define a periphery 160 of the first microelectronic device 110. In one embodiment, a first portion 162 of the microelectronic interposer 130 may be defined to be a portion of the microelectronic interposer 130 within the periphery 160 and a second portion 164 of the microelectronic interposer 130 may be defined to be a portion of the microelectronic interposer 130 that is external to the periphery 160 and extends from the first portion 162 of the microelectronic interposer 130. It is understood that, although the figures illustrate four sides 154 to the first microelectronic device 110, the first microelectronic device 110 may have any appropriate number of sides 154, beginning at one side 154 (i.e. a circular microelectronic device) to any desired number of sides 154 greater than one. It is further understood that the combination of the first microelectronic device 110, the microelectronic interposer 130, and the at least one second microelectronic device 140 may be referred to as a microelectronic device stack or as components of a microelectronic package.

Figure 2:
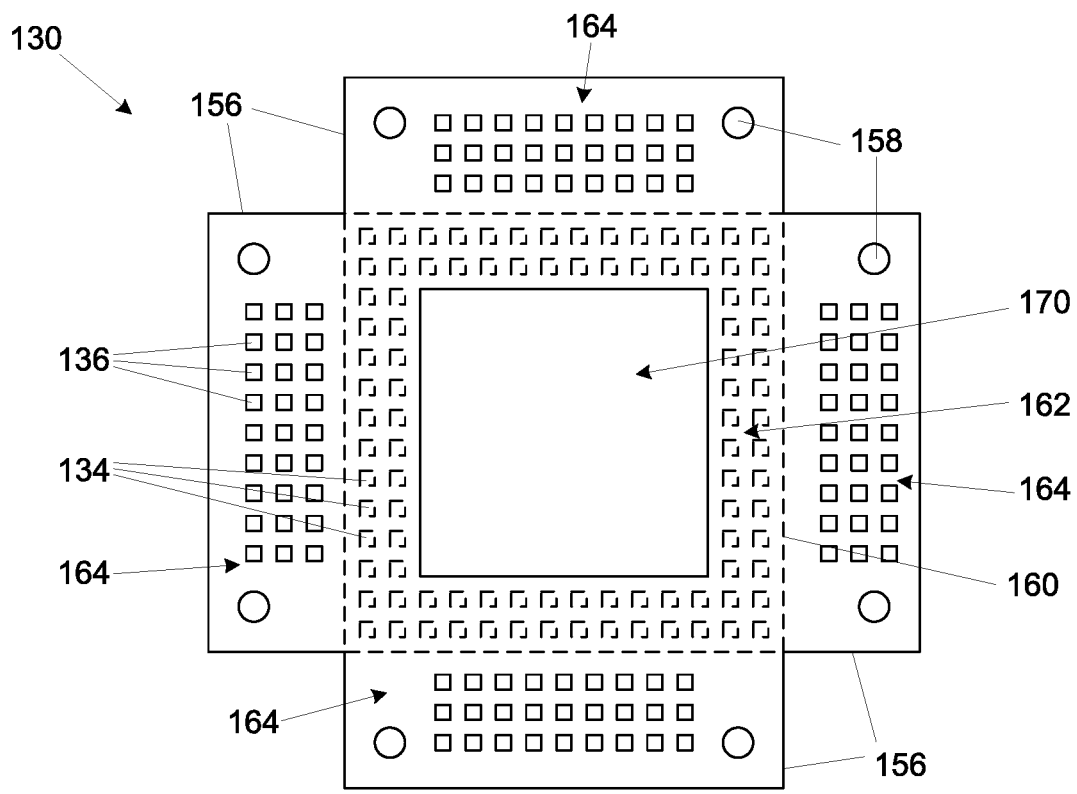
FIG. 2 illustrates a top plan view of the microelectronic interposer along line 2-2 of FIG. 1, according to an embodiment of the present description.

As further shown in FIGS. 1 and 2, the microelectronic interposer 130 may have an opening 170 extending between the microelectronic interposer first surface 132 and the microelectronic interposer second surface 138 within the first portion 162 of the microelectronic interposer 130. As can be seen in FIG. 1, the microelectronic interposer opening 170 may expose a portion of the first microelectronic device second surface 114. As will be understood to those skilled in the art, the microelectronic interposer opening 170 may be used to attach a heat dissipation device (not shown) to the first microelectronic device second surface 114. As can be seen in FIG. 2, the first plurality of interposer bond pads 134 may substantially surround the microelectronic interposer opening 170.

As still further shown in FIG. 2, the second portion 164 of the microelectronic interposer 130 may comprise at least one projection 156 extending from the first portion 162 of the microelectronic interposer 130. In one embodiment, as shown in FIG. 2, the second portion 164 (i.e. the projections 156) of the microelectronic interposer 130 may substantially surround the first portion 162 of the microelectronic interposer 130. The formation of the second portion 164 of the microelectronic interposer 130 as projections 156 may reduce material costs, as will be understood to those skilled in the art. The second portion 164 of the microelectronic interposer 130 may further comprises at least one attachment opening 158 extending therethrough. As will be understood to those skilled in the art, the attachment openings 158 may be used, along with an attachment device (not shown), to secure the microelectronic interposer 130 to the microelectronic substrate 120.

The microelectronic substrate 120 and/or the microelectronic interposer 130 may comprise any appropriate dielectric material, including, by not limited to, liquid crystal polymer, epoxy resin, bismaleimide triazine resin, FR4, polyimide materials, and the like. The substrate conductive routes 128, the interposer conductive routes 152, the substrate bond pads 124, the first plurality of interposer bond pads 134, and the second plurality of interposer bond pads 136, may be formed from any appropriate conductive material, including, but not limited to, copper, silver, gold, nickel, and alloys thereof. It is understood that the microelectronic substrate 120 and/or the microelectronic interposer 130 may be formed from any number of dielectric layers. The processes used for forming the microelectronic substrate 120 and the microelectronic interposer 130 are well known to those skilled in the art, and for the sake of brevity and conciseness will not be described or illustrated herein.

The first microelectronic device-to-substrate interconnects 126, the first microelectronic device-to-interposer interconnects 129, and/or the second microelectronic device-to-interposer interconnects 142 can be made from any appropriate material, including, but not limited to, solders and conductive filled epoxies. Solder materials may include any appropriate material, including but not limited to, lead/tin alloys, such as 63% tin/37% lead solder, or lead-free solders, such a pure tin or high tin content alloys (e.g. 90% or more tin), such as tin/bismuth, eutectic tin/silver, ternary tin/silver/copper, eutectic tin/copper, and similar alloys.

Figure 3:
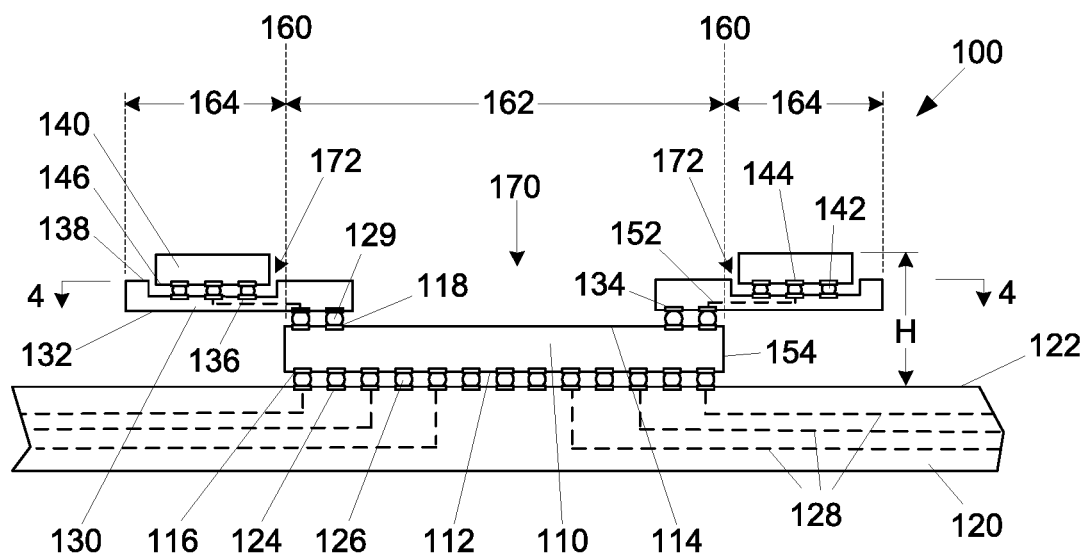
FIG. 3 illustrates a side cross-sectional view of a microelectronic structure with a microelectronic interposer having a recess formed therein, according to an embodiment of the present description.
Figure 4:
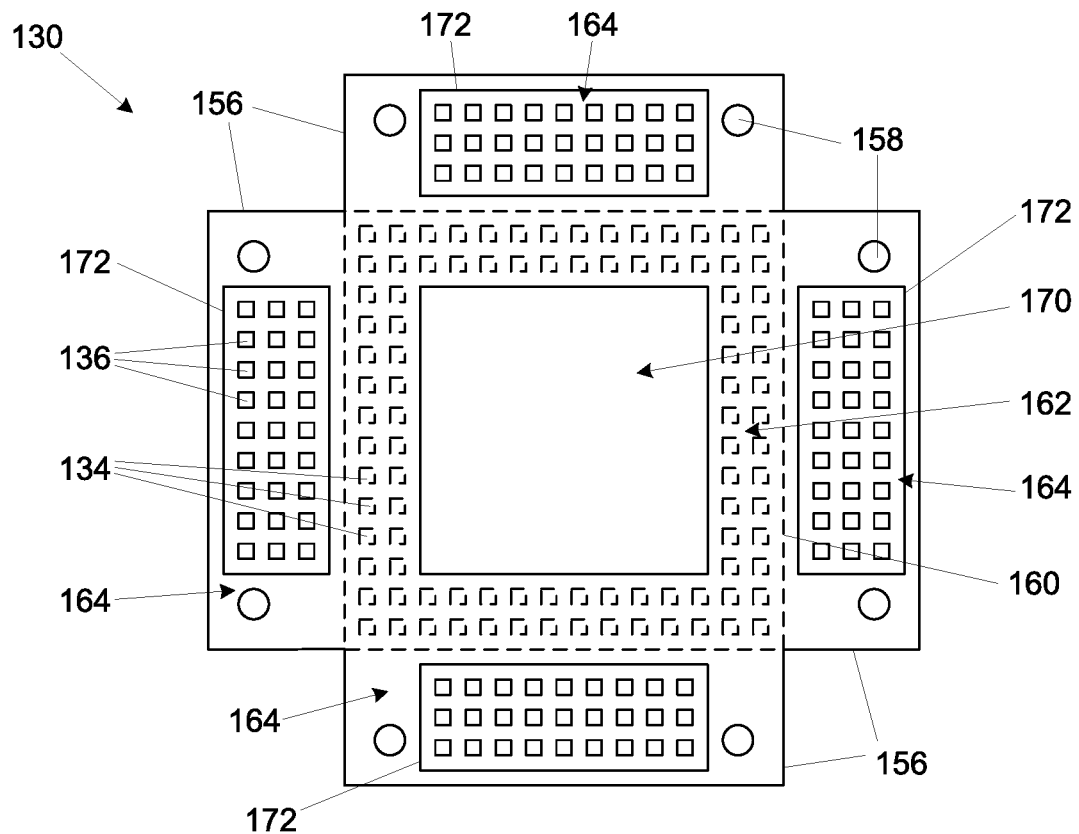
FIG. 4 illustrates a top plan view of the microelectronic interposer along line 4-4 of FIG. 3, according to an embodiment of the present description.

As shown in FIGS. 3 and 4, when a height H (see FIG. 3) of the microelectronic structure 100 is a concern, at least one recess 172 may be formed to extend into the microelectronic interposer 130 from the microelectronic interposer second surface 138 with the second plurality of interposer bond pads 136 formed within each recess 172. Each corresponding second microelectronic device 140 may be attached to the second plurality of interposer bond pads 136 within each recess 172, thereby reducing the height H of the microelectronic structure 100.

Figure 5:
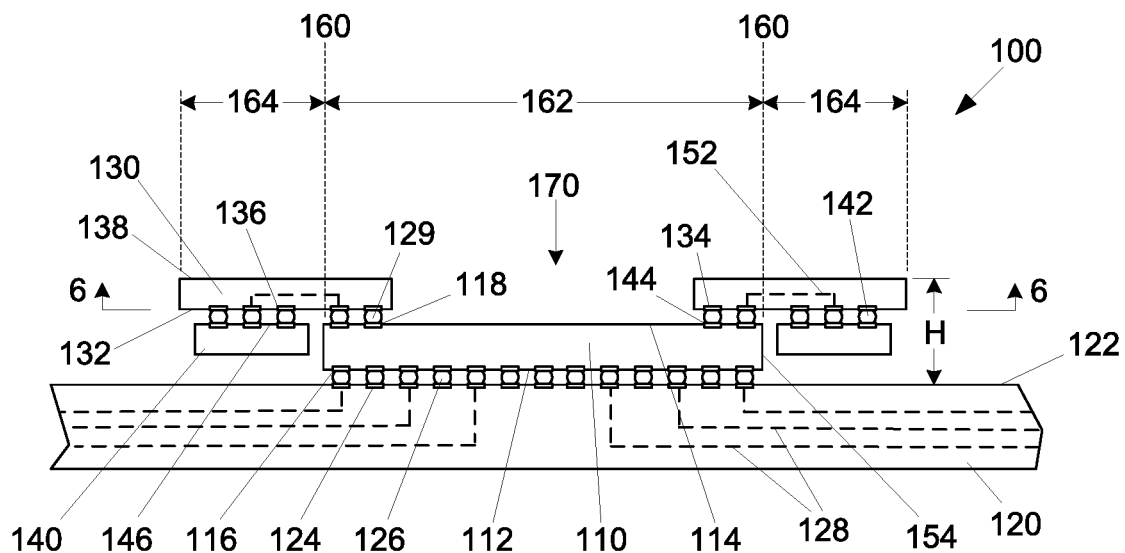
FIG. 5 illustrates a side cross-sectional view of a microelectronic structure having a microelectronic interposer, according to one embodiment of the present description.
Figure 6:
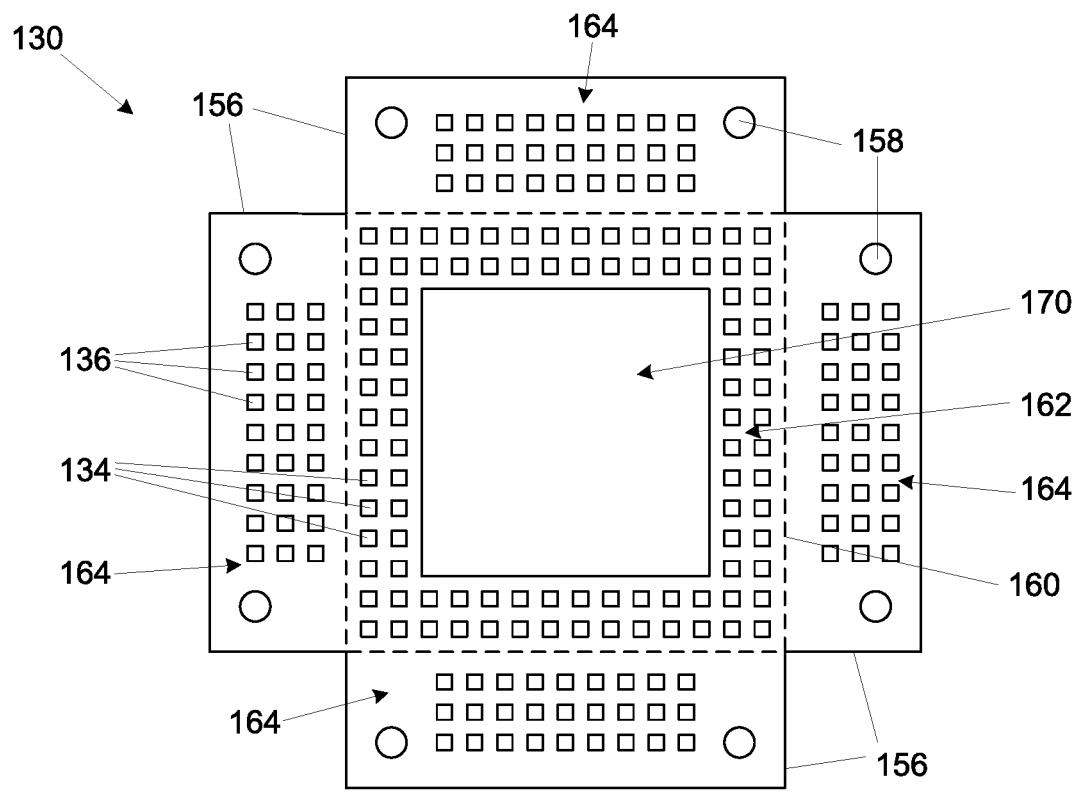
FIG. 6 illustrates a bottom plan view of the microelectronic interposer along line 6-6 of FIG. 5, according to an embodiment of the present description.
Figure 7:
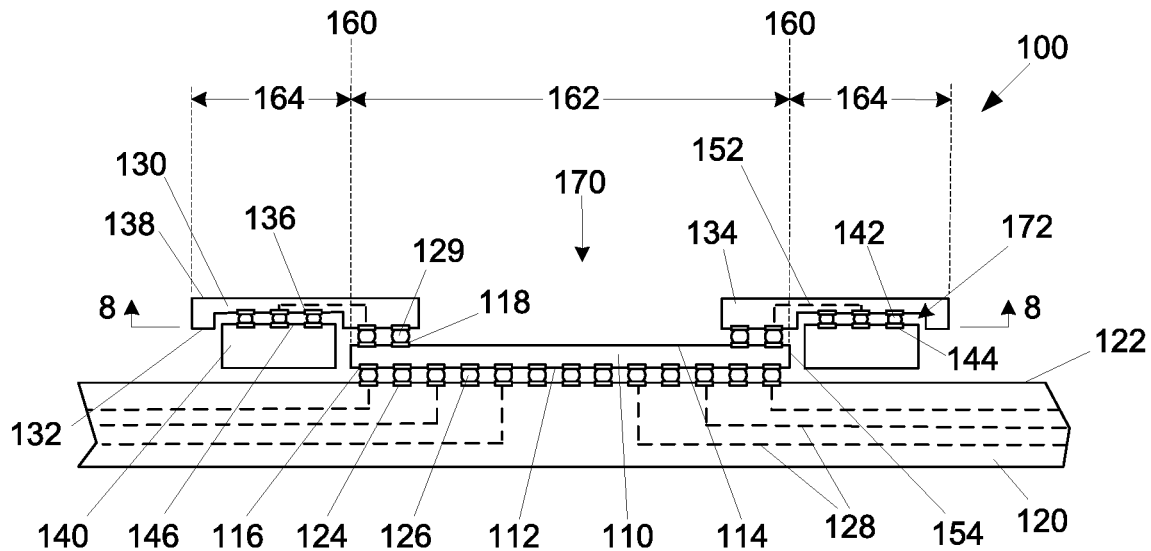
FIG. 7 illustrates a side cross-sectional view of a microelectronic structure with a microelectronic interposer having a recess formed therein, according to an embodiment of the present description.
Figure 8:
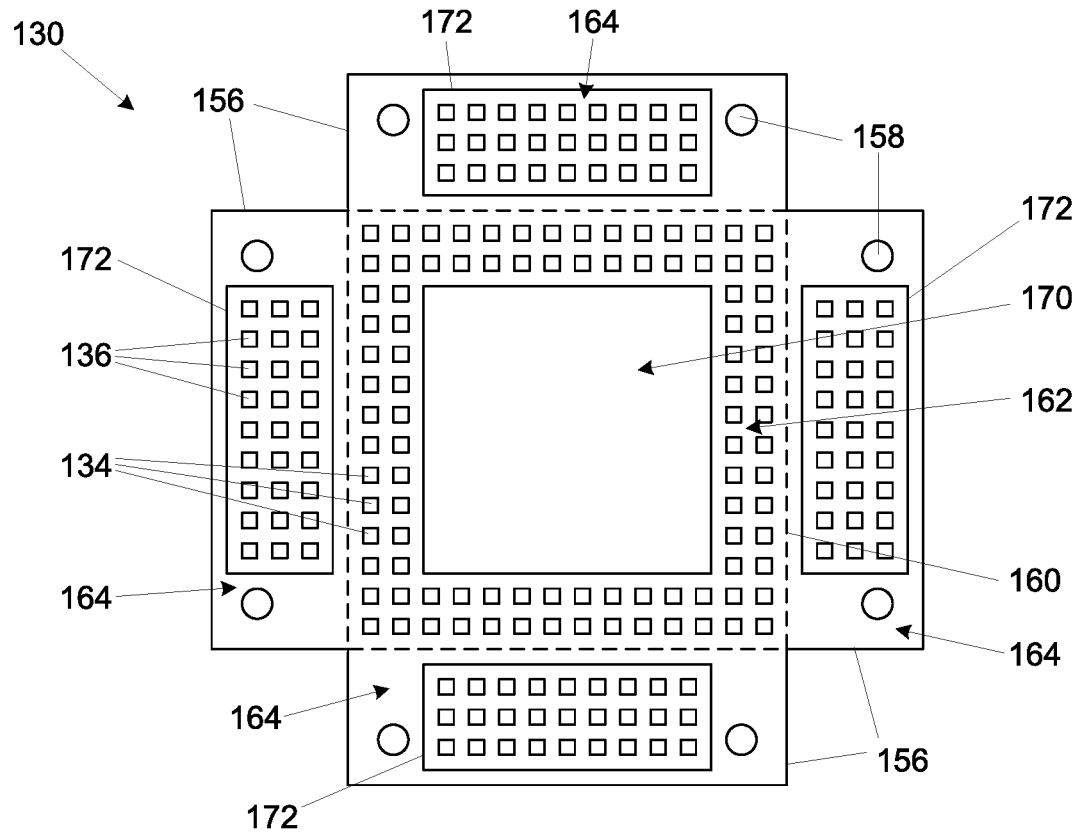
FIG. 8 illustrates a bottom plan view of the microelectronic interposer along line 8-8 of FIG. 7, according to an embodiment of the present description.

Furthermore, as shown in FIGS. 5 and 6, another potential way to reduce the height H is to form the second plurality of interposer bond pads 136 on microelectronic interposer first surface 132 and electrically attach the second microelectronic device 140 to the microelectronic interposer first surface 132, such that the second microelectronic device 140 resides between the microelectronic interposer 130 and the microelectronic substrate 120. Additionally, as shown in FIGS. 7 and 8, when there is not sufficient space between the microelectronic interposer first surface 132 and the microelectronic substrate first surface 122, at least one recess may 172 may be formed to extend into the microelectronic interposer 130 from the microelectronic interposer first surface 132 with the second plurality of bond pads 136 of the microelectronic interposer 130 formed within each recess 172. Each corresponding second microelectronic device 140 may be attached to the second plurality of interposer bond pads 136 within each recess 172.

Figure 9:
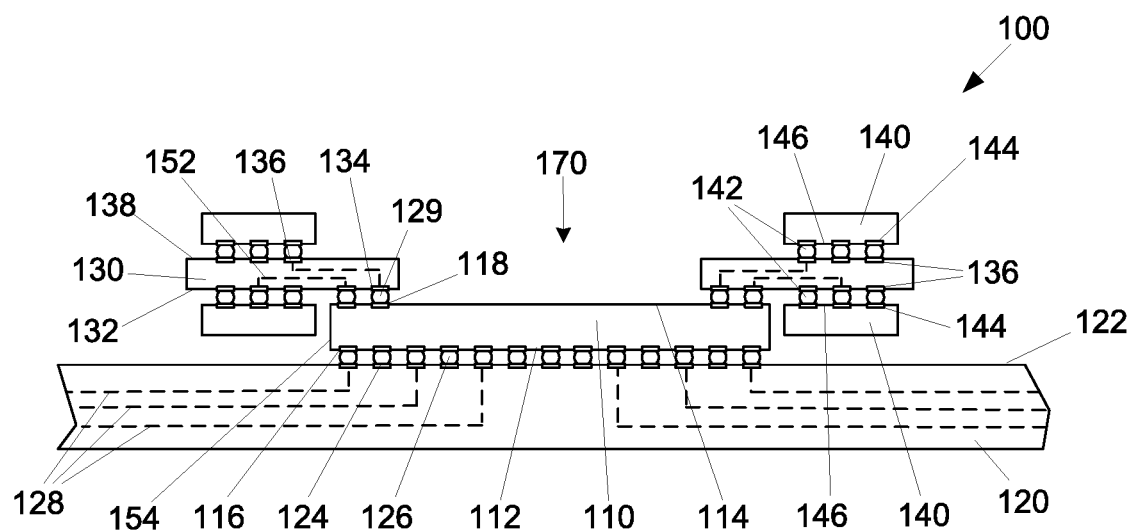
FIGS. 9 and 10 illustrate side cross-sectional views of microelectronic structures having secondary microelectronic devices attached to two sides of a microelectronic interposer, according to an embodiment of the present description.
Figure 10:
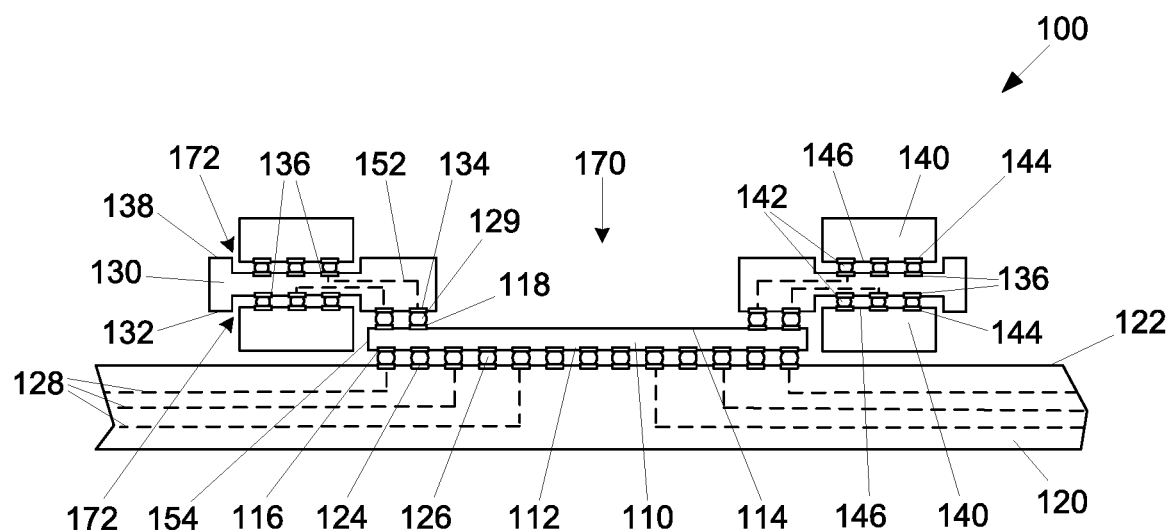

Embodiments of the present description are not limited to attaching the second microelectronic device 140 to a single surface of the microelectronic interposer 130, such as either the microelectronic interposer first surface 132 or the microelectronic interposer second surface 138. As shown in FIG. 9, the second microelectronic devices 140 may be electrically attached to both the microelectronic interposer first surface 132 and the microelectronic interposer second surface 138. Furthermore, the recesses 172 in the microelectronic interposer 130, as discussed with regard to FIGS. 3-4 and 7-8, may be incorporating into the embodiment of FIG. 9, as shown in FIG. 10.

Figure 11:
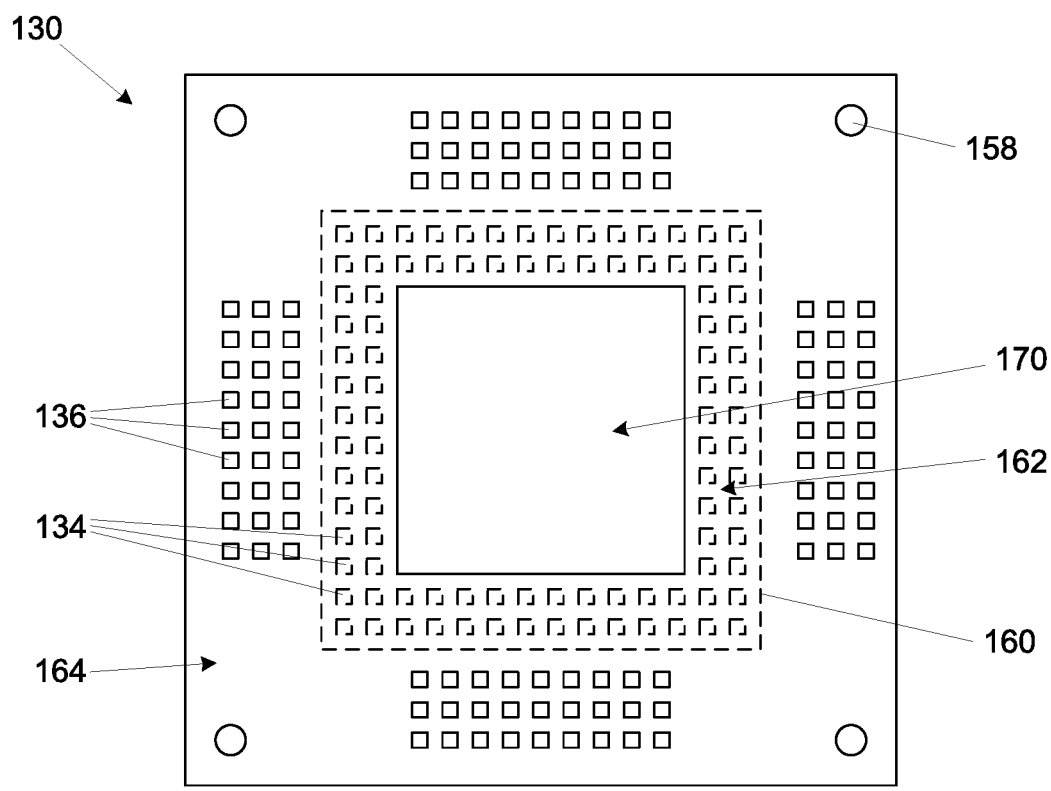
FIGS. 11-14 illustrates top plan view of various configurations of microelectronic interposers, according to embodiments of the present description.
Figure 12:
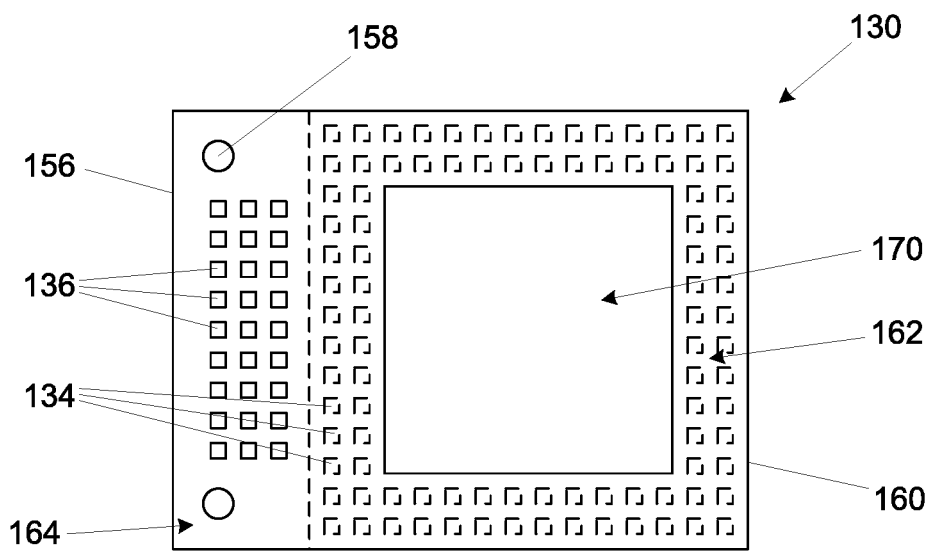
Figure 13:
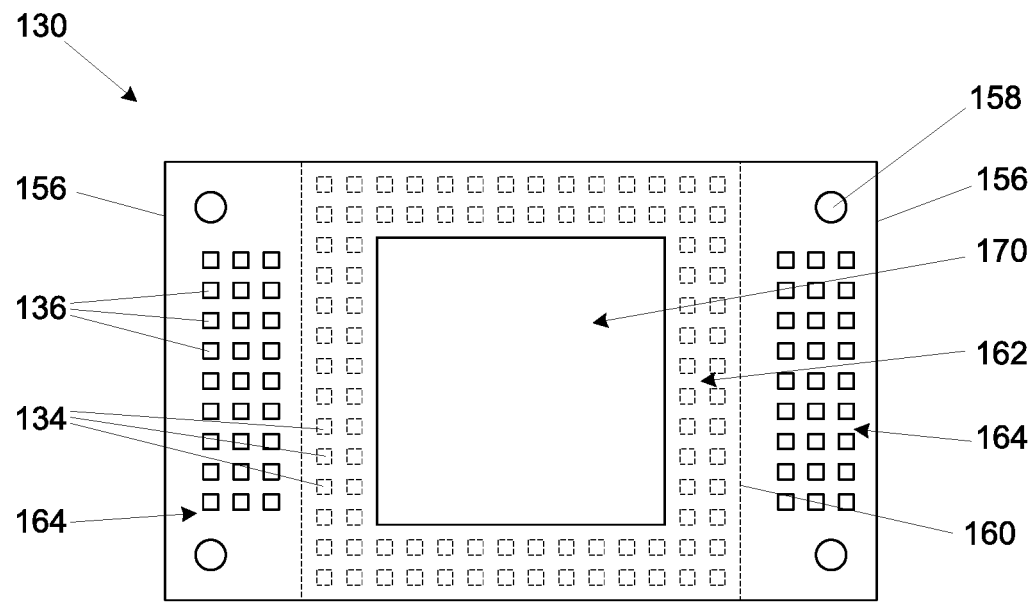
Figure 14:
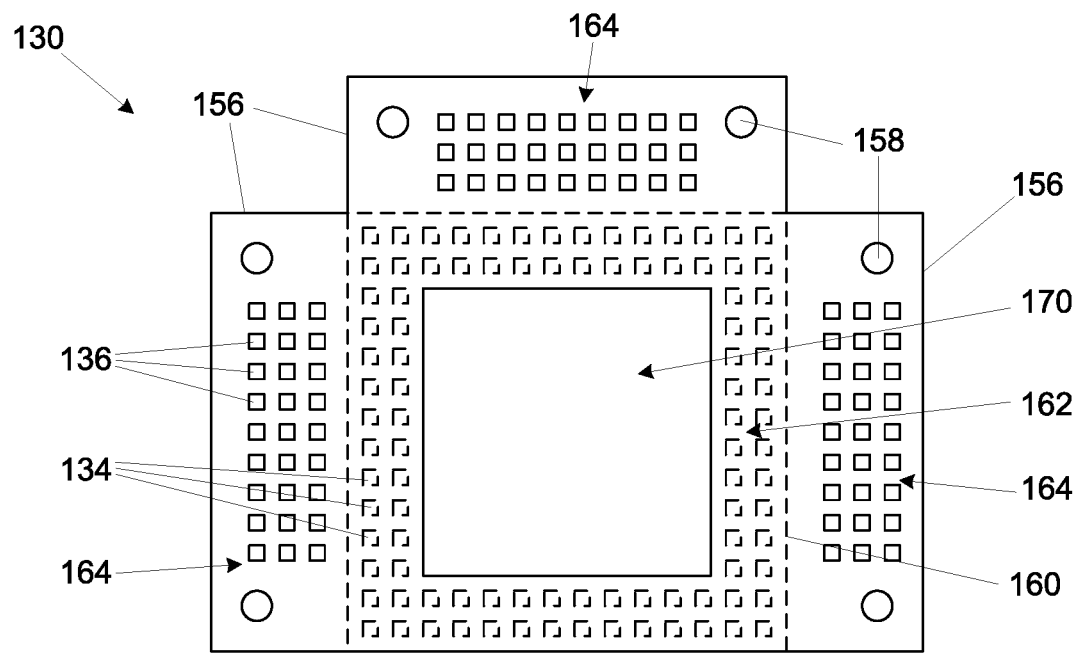

It is understood that the microelectronic interposer 130 of the present description is not limited to the "four projection" configuration shown in FIGS. 1-10. FIGS. 11-14 illustrate additional embodiments of the microelectronic interposer 130. FIG. 11 illustrates an embodiment wherein there no projections (such as projections 156 of FIGS. 1-10), rather the second portion 164 of the microelectronic interposer 130 may substantially surround the first portion 162 of the microelectronic interposer 130. FIG. 12 illustrates a single projection 156 configuration. FIG. 13 illustrates a dual projection 156 configuration, wherein two projections 156 may be formed on opposing sides of the first portion 162 of the microelectronic interposer 130. FIG. 14 illustrates a triple projection 156 configuration.

Figure 15:
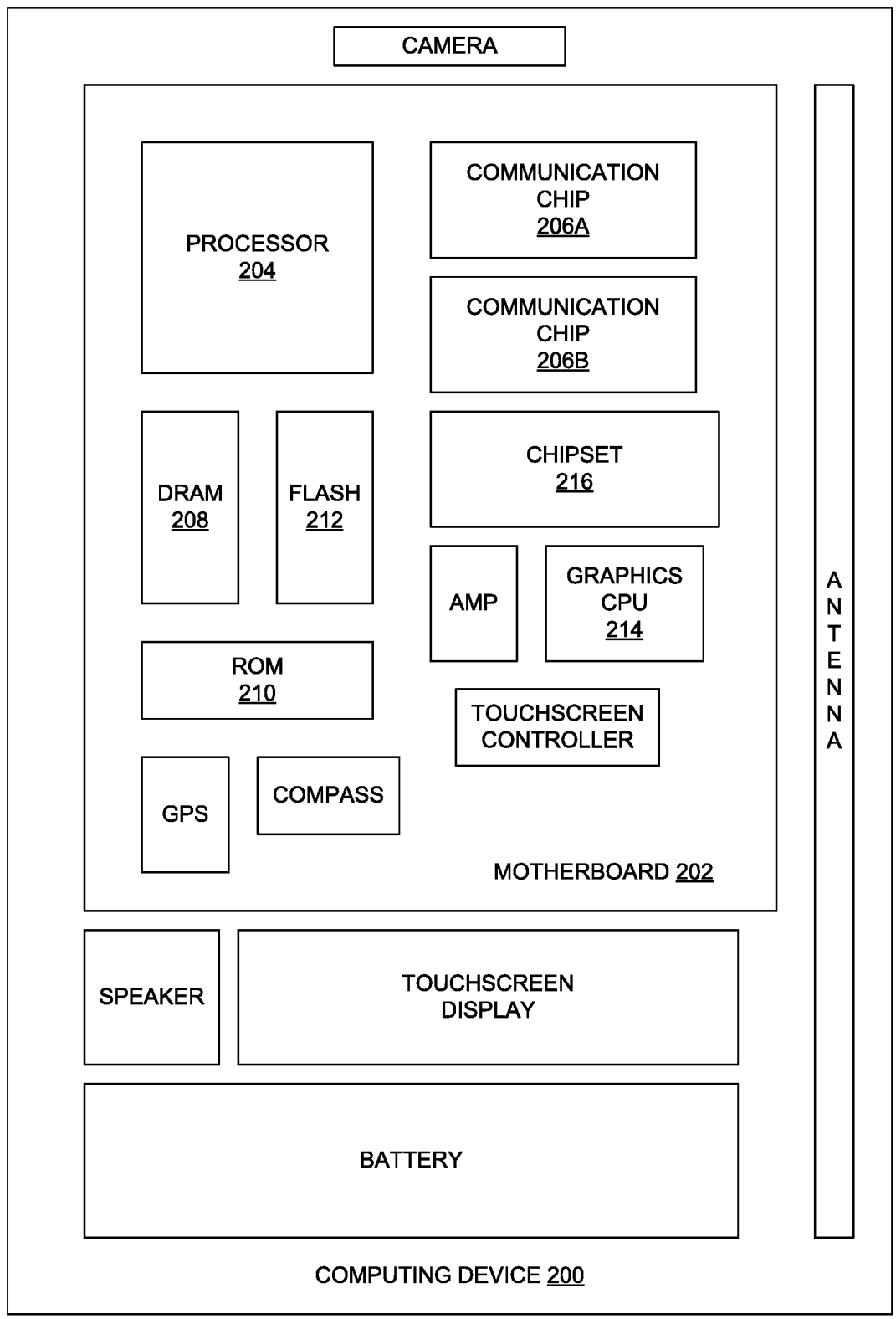
FIG. 15 illustrates a computing device in accordance with one implementation of the present description.

FIG. 15 illustrates a computing device 200 in accordance with one implementation of the present description. The computing device 200 houses a board 202. The board 202 may include a number of microelectronic components attached thereto, including but not limited to a processor 204, at least one communication chip 206A, 206B, volatile memory 208, (e.g., DRAM), non-volatile memory 210 (e.g., ROM), flash memory 212, a graphics processor or CPU 214, a digital signal processor (not shown), a crypto processor (not shown), a chipset 216, an antenna, a display (touch-screen display), a touchscreen controller, a battery, an audio codec (not shown), a video codec (not shown), a power amplifier (AMP), a global positioning system (GPS) device, a compass, an accelerometer (not shown), a gyroscope (not shown), a speaker (not shown), a camera, and a mass storage device (not shown) (such as hard disk drive, compact disk (CD), digital versatile disk (DVD), and so forth). Any of the microelectronic components may be physically and electrically coupled to the board 202. In some implementations, at least one of the microelectronic components may be a part of the processor 204.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

Any of the microelectronic components within the computing device 200 may include a microelectronic package attached to the board 202, wherein the microelectronic package includes a first microelectronic device attached to the board, where the side(s) of the first microelectronic device define a periphery, a microelectronic interposer electrically attached to the first microelectronic device, wherein a first portion of the microelectronic interposer resides within the periphery of the first microelectronic device, wherein a second portion of the microelectronic interposer resides outside the periphery of the first microelectronic device, and a second microelectronic device electrically attached to the microelectronic interposer second portion.

In various implementations, the computing device may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-15. The subject matter may be applied to other microelectronic devices and assembly applications, as well as any appropriate electronic application, as will be understood to those skilled in the art.

The follow examples pertain to further embodiments and specifics in the examples may be used anywhere in one or more embodiments, wherein Example 1 is a microelectronic structure, comprising a microelectronic interposer having a first surface and an opposing second surface; a first plurality of bond pads formed in a first portion of the microelectronic interposer in or on the microelectronic interposer first surface; and a second plurality of bond pads formed in a second portion of the microelectronic interposer, wherein the second portion of the microelectronic interposer extends from the first portion of the microelectronic interposer, and wherein each of the bond pads of the second plurality of bond pads is electrically connected to a corresponding bond pad of the first plurality of bond pads.

In Example 2, the subject matter of Example 1 can optionally include a recess extending into the microelectronic interposer from the microelectronic interposer first surface, and wherein at least one of the second plurality of bond pads is disposed within the recess.

In Example 3, the subject matter of Example 1 can optionally include a recess extending into the microelectronic interposer from the microelectronic interposer second surface, and wherein at least one of second plurality of bond pads is disposed within the recess.

In Example 4, the subject matter of any of Examples 1 to 3 can optionally include an opening extending between the microelectronic interposer first surface and the microelectronic interposer second surface within the first portion of the microelectronic interposer.

In Example 5, the subject matter of Example 4 can optionally include the first plurality of bond pads surround the opening.

In Example 6, the subject matter of any of Examples 1 to 3 can optionally include the second portion of the microelectronic interposer including at least one projection extending from the first portion of the microelectronic interposer.

In Example 7, the subject matter of any of Examples 1 to 3 can optionally include the second portion of the microelectronic interposer substantially surrounding the first portion of the microelectronic interposer.

In Example 8, a microelectronic package may comprise a first microelectronic device having a first surface, an opposing second surface, and at least one side extending between the first surface and the second surface, wherein the at least one side defines a periphery of the first microelectronic device; a microelectronic interposer having a first surface and an opposing second surface; wherein the microelectronic interposer first surface is electrically attached to the first microelectronic device second surface, wherein a first portion of the microelectronic interposer resides within the periphery of the first microelectronic device, wherein a second portion of the microelectronic interposer resides outside the periphery of the first microelectronic device; and at least one second microelectronic device having a first surface, wherein the second microelectronic device first surface is electrically attached to the microelectronic interposer second portion.

In Example 9, the subject matter of Example 8 can optionally include the at least one second microelectronic device electrically attached to one of the microelectronic interposer first surface and the microelectronic interposer second surface.

In Example 10, the subject matter of Example 9 can optionally include the second portion of the microelectronic interposer including a recess from therein, wherein the recess extends into the microelectronic interposer from the microelectronic interposer first surface, and wherein the second microelectronic device is attached within the recess.

In Example 11, the subject matter of Example 9 can optionally include the second portion of the microelectronic interposer includes a recess from therein, wherein the recess extends into the microelectronic interposer from the microelectronic interposer second surface, and wherein the second microelectronic device is attached within the recess.

In Example 12, the subject matter of any of Examples 8 to 11 can optionally include the first portion of the microelectronic interposer including an opening extending between the microelectronic interposer first surface and the microelectronic interposer second surface, wherein the microelectronic interposer opening exposes a portion of the first microelectronic device second surface.

In Example 13, the subject matter of any of Examples 8 to 11 can optionally include the second portion of the microelectronic interposer including at least one projection.

In Example 14, the subject matter of Example 13 can optionally include the at least one second microelectronic device being attached to the at least one projection.

In Example 15, the subject matter of Example 14 can optionally include the at least one projection including at least one recess formed therein, and wherein the at least one second microelectronic device is disposed within the recess.

In Example 16, the subject matter of any of Examples 8 to 11 can optionally include a first plurality of bond pads formed in a first portion of the microelectronic interposer; and a second plurality of bond pads formed in a second portion of the microelectronic interposer, wherein each of the bond pads of the second plurality of bond pads is electrically connected to a corresponding bond pad of the first plurality of bond pads.

In Example 17, an electronic system may comprise a motherboard and a microelectronic package attached to the board, wherein the microelectronic package includes a first microelectronic device having a first surface, an opposing second surface, and at least one side extending between the first surface and the second surface, wherein the first microelectronic device first surface is electrically attached to the motherboard and wherein the at least one side defines a periphery of the first microelectronic device; a microelectronic interposer having a first surface and an opposing second surface; wherein the microelectronic interposer first surface is electrically attached to the first microelectronic device second surface, wherein a first portion of the microelectronic interposer resides within the periphery of the first microelectronic device, wherein a second portion of the microelectronic interposer resides outside the periphery of the first microelectronic device; and a second microelectronic device having a first surface and an opposing second surface, wherein the second microelectronic device first surface is electrically attached to the microelectronic interposer second portion.

In Example 18, the subject matter of Example 17 can optionally include the at least one second microelectronic device electrically attached to one of the microelectronic interposer first surface and the microelectronic interposer second surface.

In Example 19, the subject matter of Example 18 can optionally include the second portion of the microelectronic interposer including a recess from therein, wherein the recess extends into the microelectronic interposer from the microelectronic interposer first surface, and wherein the second microelectronic device is attached within the recess.

In Example 20, the subject matter of Example 18 can optionally include the second portion of the microelectronic interposer includes a recess from therein, wherein the recess extends into the microelectronic interposer from the microelectronic interposer second surface, and wherein the second microelectronic device is attached within the recess.

In Example 21, the subject matter of any of Examples 17 to 20 can optionally include the first portion of the microelectronic interposer including an opening extending between the microelectronic interposer first surface and the microelectronic interposer second surface, wherein the microelectronic interposer opening exposes a portion of the first microelectronic device second surface.

In Example 22, the subject matter of any of Examples 17 to 20 can optionally include the second portion of the microelectronic interposer including at least one projection.

In Example 23, the subject matter of Example 22 can optionally include the at least one second microelectronic device being attached to the at least one projection.

In Example 24, the subject matter of Example 23 can optionally include the at least one projection including at least one recess formed therein, and wherein the at least one second microelectronic device is disposed within the recess.

In Example 25, the subject matter of any of Examples 17 to 20 can optionally include a first plurality of bond pads formed in a first portion of the microelectronic interposer; and a second plurality of bond pads formed in a second portion of the microelectronic interposer, wherein each of the bond pads of the second plurality of bond pads is electrically connected to a corresponding bond pad of the first plurality of bond pads.

Having thus described in detail embodiments of the present description, it is understood that the present description defined by the appended claims is not to be limited by particular details set forth in the above description, as many apparent variations thereof are possible without departing from the spirit or scope thereof.

What is claimed is:

1. A microelectronic package comprising:
a first microelectronic device having a first surface, an opposing second surface, and at least one side extending between the first surface and the second surface, wherein the at least one side defines a periphery of the first microelectronic device;
a microelectronic interposer having a first surface and an opposing second surface; wherein the microelectronic interposer first surface is electrically attached to the first microelectronic device second surface, wherein a first portion of the microelectronic interposer resides within the periphery of the first microelectronic device, wherein a second portion of the microelectronic interposer resides outside the periphery of the first microelectronic device, wherein the second portion of the microelectronic interposer includes a recess formed therein, and wherein the recess extends into the microelectronic interposer from the microelectronic interposer first surface; and
at least one second microelectronic device electrically attached to the microelectronic interposer second portion, wherein the at least one second microelectronic device is entirely outside the periphery of the first microelectronic device, wherein the second microelectronic device is electrically connected to the first microelectronic device with at least one conductive route within the microelectronic interposer, and wherein the at least one second microelectronic device is attached within the recess.

2. The microelectronic package of claim 1, wherein the at least one second microelectronic device is electrically attached to one of the microelectronic interposer first surface and the microelectronic interposer second surface.

3. The microelectronic package of claim 1, wherein the second portion of the microelectronic interposer includes a recess from therein, wherein the recess extends into the microelectronic interposer from the microelectronic interposer second surface, and wherein the at least one second microelectronic device is attached within the recess.

4. The microelectronic package of claim 1, wherein the second portion of the microelectronic interposer includes at least one projection.

5. The microelectronic package of claim 4, wherein the at least one second microelectronic device is attached to the at least one projection.

6. The microelectronic package of claim 5, wherein the at least one projection includes at least one recess formed therein, and wherein the at least one second microelectronic device is attached within the recess.

7. The microelectronic package of claim 1, wherein the at least one conductive route within the microelectronic interposer extends between a bond pad formed in a first portion of the microelectronic interposer and a second plurality of bond pads formed in a second portion of the microelectronic interposer.

8. The microelectronic package of claim 1, wherein the microelectronic interposer is electrically attached to the first microelectronic device second surface with at least one interconnect.

9. The microelectronic package of claim 8, wherein the at least one interconnect comprises solder.

10. The microelectronic package of claim 1, wherein the at least one second microelectronic device is electrically attached to the microelectronic interposer with at least one interconnect.

11. The microelectronic package of claim 10, wherein the at least one interconnect comprises solder.

12. A microelectronic package comprising:
a first microelectronic device having a first surface, an opposing second surface, and at least one side extending between the first surface and the second surface, wherein the at least one side defines a periphery of the first microelectronic device;

a microelectronic interposer having a first surface and an opposing second surface; wherein the microelectronic interposer first surface is electrically attached to the first microelectronic device second surface, wherein a first portion of the microelectronic interposer resides within the periphery of the first microelectronic device, and wherein a second portion of the microelectronic interposer resides outside the periphery of the first microelectronic device, wherein the first portion of the microelectronic interposer includes an opening extending between the microelectronic interposer first surface and the microelectronic interposer second surface, wherein the microelectronic interposer opening exposes a portion of the first microelectronic device second surface; and at least one second microelectronic device electrically attached to the microelectronic interposer second portion, wherein the at least one second microelectronic device is entirely outside the periphery of the first microelectronic device, and wherein the second microelectronic device is electrically connected to the first microelectronic device with at least one conductive route within the microelectronic interposer.

13. The microelectronic package of claim 12, wherein the at least one second microelectronic device is electrically attached to one of the microelectronic interposer first surface and the microelectronic interposer second surface.

14. The microelectronic package of claim 12, wherein the second portion of the microelectronic interposer includes a recess from therein, wherein the recess extends into the microelectronic interposer from the microelectronic interposer second surface, and wherein the at least one second microelectronic device is attached within the recess.

15. The microelectronic package of claim 12, wherein the second portion of the microelectronic interposer includes at least one projection.

16. The microelectronic package of claim 15, wherein the at least one second microelectronic device is attached to the at least one projection.

17. The microelectronic package of claim 16, wherein the at least one projection includes at least one recess formed therein, and wherein the at least one second microelectronic device is attached within the recess.

18. The microelectronic package of claim 12, wherein the at least one conductive route within the microelectronic interposer extends between a bond pad formed in a first portion of the microelectronic interposer and a second plurality of bond pads formed in a second portion of the microelectronic interposer.

19. The microelectronic package of claim 12, wherein the microelectronic interposer is electrically attached to the first microelectronic device second surface with at least one interconnect.

20. The microelectronic package of claim 12, wherein the at least one second microelectronic device is electrically attached to the microelectronic interposer with at least one interconnect.

* * * * *